(12) United States Patent
Tanaka et al.

(10) Patent No.: US 6,570,800 B2
(45) Date of Patent: May 27, 2003

(54) HIGH SPEED CLOCK SYNCHRONOUS SEMICONDUCTOR MEMORY IN WHICH THE COLUMN ADDRESS STROBE SIGNAL IS VARIED IN ACCORDANCE WITH A CLOCK SIGNAL

(75) Inventors: Yousuke Tanaka, Ome (JP); Masahiro Katayama, Maebashi (JP); Yuji Yokoyama, Ome (JP); Hiroshi Akasaki, Ome (JP); Shuichi Miyaoka, Hannou (JP); Toru Kobayashi, Iruma (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

(21) Appl. No.: 09/756,800

(22) Filed: Jan. 10, 2001

(65) Prior Publication Data

US 2001/0007539 A1 Jul. 12, 2001

(30) Foreign Application Priority Data

Jan. 12, 2000 (JP) ........................................ 2000-006267

(51) Int. Cl.[7] .................................................. G11C 7/00
(52) U.S. Cl. ........................ 365/219; 365/233; 365/220; 365/230
(58) Field of Search ................................ 365/219, 233, 365/220, 230

(56) References Cited

U.S. PATENT DOCUMENTS

| | | | | |
|---|---|---|---|---|
| 5,086,388 A | * | 2/1992 | Matoba | 395/425 |
| 5,508,967 A | * | 4/1996 | Karino | 365/219 |
| 6,327,206 B2 | * | 12/2001 | Kubota et al. | 365/219 |
| 6,343,041 B1 | * | 1/2002 | Kanazashi | 365/219 |
| 6,392,946 B1 | * | 5/2002 | Wu et al. | 365/219 |

* cited by examiner

Primary Examiner—David Nelms
Assistant Examiner—Connie C. Yoha
(74) Attorney, Agent, or Firm—Antonelli, Terry, Stout & Kraus, LLP

(57) ABSTRACT

The column address strobe signal (CAS) which is changed in cycles as many as a plurality of times that of a clock signal cycle is input to the memory block (MBK0 to MBKn). A plurality of serial data readout from the memory cell array (10) and parallel/serial converted by a parallel/serial converter circuit (21) in synchronism with a clock signal cycle are output for every cycle when the column address signal (CASADR) is changed. Parallel data input to the memory block and serial/parallel converted by a serial/parallel converter circuit (25) in synchronism with the clock signal cycle are written in the memory cell array. In this way, the access specification that the column address strobe signal is varied once per n cycles of the clock signal allows for a more rapid memory operation.

9 Claims, 12 Drawing Sheets

(READ AND WRITE IN SERIES, CAS LATENCY: 4)

HIGH SPEED CLOCK SYNCHRONOUS SEMICONDUCTOR MEMORY IN WHICH THE COLUMN ADDRESS STROBE SIGNAL IS VARIED IN ACCORDANCE WITH A CLOCK SIGNAL

BACKGROUND OF THE INVENTION

In a synchronous DRAM operating synchronously with a clock signal, the operation delay time from a change in column address signal to determination of read data can be defined as a CAS latency corresponding to a number of cycles of the clock signal. The operation delay time required for a data reading operation of the synchronous DRAM is determined by its circuit configuration uniquely. Therefore, the CAS latency is desired to be determined appropriately in accordance with the frequency of the clock signal to be used. In general, the higher the frequency of the clock signal being used, the larger will be the value of the CAS latency relatively speaking. A technique for controlling the output timing of an output buffer in accordance with a set value of the CAS latency is disclosed in Japanese Patent Laid-Open No. 215575/94 (U.S. Pat. No. 5,384,735), Japanese Patent Laid-Open No. 6-6846/99 and Japanese Patent Laid-open No. 302463/98 (U.S. Pat. No. 5,901,109), for example.

SUMMARY OF THE INVENTION

The present inventor has reviewed a clock synchronous memory having a much higher operation speed. That is, in response to a great enhancement of the data processing speed of a data processor, for example, a memory is provided for supporting a burst operation and pipeline burst access. However, this is not enough for increasing the operation speed. Thus, the present inventor has considered the possibility of changing the column address strobe signal once for every n cycles of the clock signal in order to divide information obtained through one column access operation for every clock signal cycle and output them to the outside. However, in that case, when the column address strobe signal is changed with a cycle shorter than n cycles of the clock signal, an error operation may occur in a regular memory operation. Especially, a rapidly operated memory control line is exposed to high frequency noise, for example. Therefore, the column address strobe signal can be influenced in actual practice. Thus, the inventor has found the effectiveness of providing a protective circuit within or in the vicinity of a semiconductor memory in order to satisfy a requirement that the column address strobe signal be changed once for every n cycles of the clock signal. Further, the inventor also clarified the fact that the protective circuit must be configured with respect to the CAS latency, when the CAS latency variable configuration is used.

It is an object of the present invention to provide a semiconductor integrated circuit, which can increase the speed of memory operations by means of an access specification for changing a column address strobe signal once per a predetermined plurality of cycles (n cycle hereinafter) of a clock signal.

It is another object of the present invention to provide a semiconductor integrated circuit which can prevent an erroneous operation from occurring when an external column address strobe signal does not satisfy the access specification for changing a column address strobe signal once for every n cycles of a clock signal.

These and other objects and novel features of the present invention will be apparent from the description herein and the accompanying drawings.

The present invention disclosed herein can be summarized as follows:

A semiconductor integrated circuit includes a memory block having a memory cell array, a row select circuit, a column select circuit, a serial/parallel converter circuit, a write amplifier, a main amplifier and a parallel/serial converter circuit. The memory cell array has a plurality of memory cells whose selector terminal is connected to a word line and whose data input/output terminal is connected to a bit line. The row select circuit selects a word line specified by a row address signal in response to a change in a row address strobe signal in synchronism with a clock signal. The column select circuit selects a plurality of bit lines in parallel, as specified by a column address signal in response to a change in a column address strobe signal, in synchronism with a clock signal. The serial/parallel converter circuit converts serial data from the outside to parallel data in synchronism with a clock signal. The write amplifier outputs, in parallel, an output from the serial/parallel converter circuit to the plurality of bit lines selected by the column select circuit. The main amplifier amplifies the parallel data output in parallel from the plurality of bit lines selected by the column select circuit. The parallel/serial converter circuit converts parallel data supplied from the main amplifier to serial data in synchronism with a clock signal. The column address strobe signal, which is changed in cycles as many as a plurality of times that of a clock signal cycle, is input to the memory block. A plurality of serial data, read out from the memory cell array and parallel/serial converted in synchronism with a clock signal cycle, are output for every cycle when the column address signal is changed. Parallel data, input to the memory block and serial/parallel converted in synchronous with the clock signal cycle, is written in the memory cell array. In this way, the access specification that the column address strobe signal is varied once per n cycles of the clock signal allows more rapid memory operation.

A serial data input path of the serial/parallel converter circuit and a serial data output path of the parallel/serial converter circuit may be provided independently. In a read operation, the parallel data is read out from the memory cell array in response to a change in the column address strobe signal, and then serial data is output from the memory block, where a time for parallel/serial conversion is necessary between the readout and the output. On the other hand, in a write operation, before parallel data is written into the memory cell array in response to the change in the column address strobe signal, serial data which has been input to the memory block in advance must be converted to parallel data completely in synchronism with input latch control signals. In this case, when a read operation is instructed subsequently to a write operation, an operation for inputting serial data for the write operation to the memory block sequentially in serial may need to be performed in parallel with an operation for outputting the serial data provided by the read operation from the memory block. That is, the timing for outputting serial data from the memory block and the timing for inputting serial data to the memory block may possibly overlap. As described above, providing the serial data input path and the serial data output path for the memory block independently allows avoidance of data collision in the case of overlapping of such processing. As a result, efficient processing can be achieved.

Further, a CAS input inhibiting circuit may be provided for inhibiting an input of a new change in the column address strobe signal in accordance with a CAS latency corresponding to the number of clock signal cycles during a period from one next to clock synchronous timing for the change in column address strobe signal to determination of a data input of the parallel/serial converter circuit. This CAS input inhibiting circuit, may be provided either external or internal of the memory block. Thus, when a column address strobe signal CAS from the outside does not satisfy the access specification that a column address strobe signal is changed once per n cycles of the clock signal, an error operation can be prevented.

A CAS latency control circuit may be adopted which can input a latency set signal so as to control the CAS latency in a variable manner. In this case, the CAS latency control circuit controls timing for latching parallel outputs from the main amplifier in the parallel/serial converter circuit.

When the CAS latency control circuit is adopted, the CAS input inhibiting circuit suppresses an input of a new change in the column address strobe signal until immediately before a lapse of a period corresponding to a CAS latency specified by the latency set signal. In that case, input inhibiting control on undesirable changes in CAS can be achieved even when the CAS latency is variable.

DETAILED DESCRIPTION OF THE INVENTION

Figure 12:
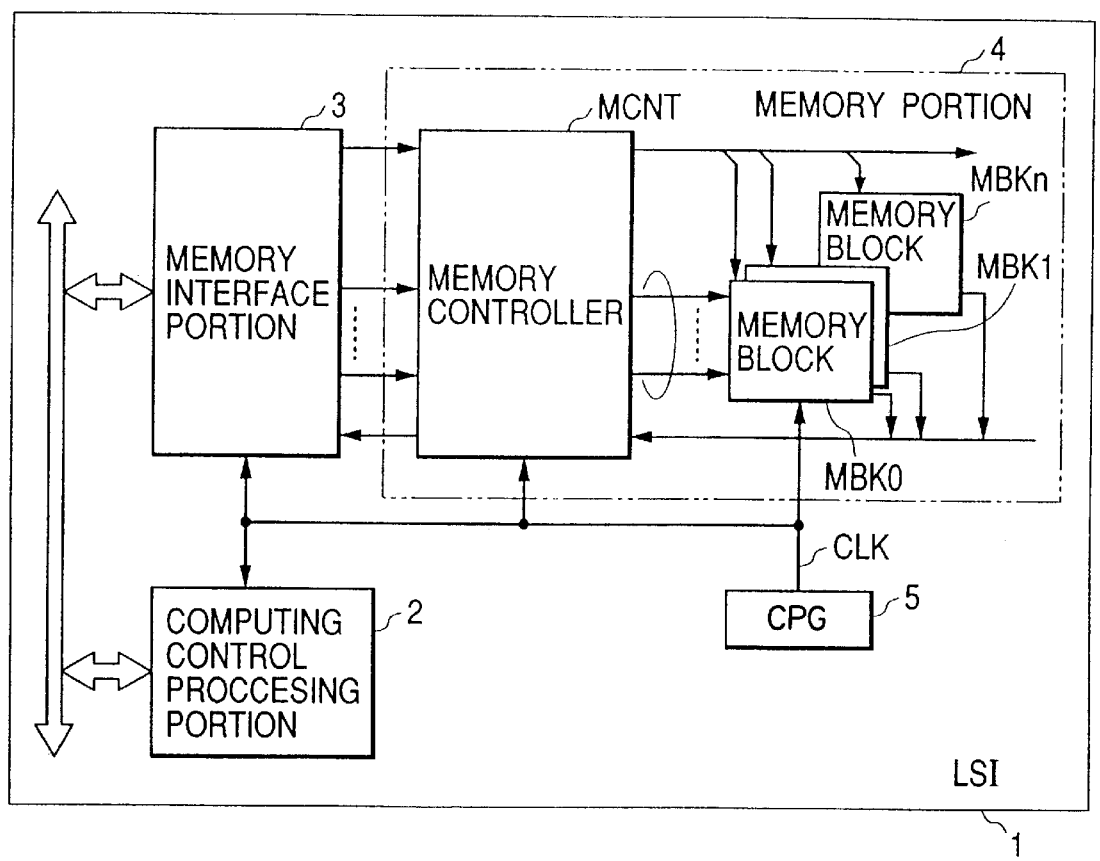
FIG. 12 is a block diagram showing one example of the semiconductor integrated circuit according to the present invention as a whole.

FIG. 12 shows one example of a semiconductor integrated circuit (LSI) according to the present invention. The semiconductor integrated circuit 1 shown in FIG. 12 is a logic consolidated DRAM, in which a logic circuit is provided along with a clock synchronous type DRAM, formed on one semiconductor substrate (semiconductor chip) made of single crystal silicon, for example. The semiconductor integrated circuit 1 has, but the invention is not limited to, a computing control processing portion 2 and a memory interface portion 3, which are connected to each other. Connected to the memory interface portion 3 is a clock synchronous type memory portion 4. The computing control portion 2, memory interface portion 3 and memory portion 4 operate in synchronism with an operation reference clock signal CLK. The operation reference clock signal. CLK is generated by a clock pulse generator (CPG) 5. The computing control processing portion 2 is operated under program control or state transition control, for example, and can mainly access the memory portion 4. The computing control processing portion 2 may be a data processor unit, a microprocessor unit or an accelerator unit, for example. The memory interface portion 3 generates a strobe signal dedicated for the memory portion 4 in order to respond to an access instruction from the computing control processing portion 2. Further, the memory interface portion 3 performs timing control in accordance with the operation speed of the memory portion 4. The memory potion 4 has a memory controller MCNT and a plurality of memory blocks MBK0 to MBKn.

Figure 1:
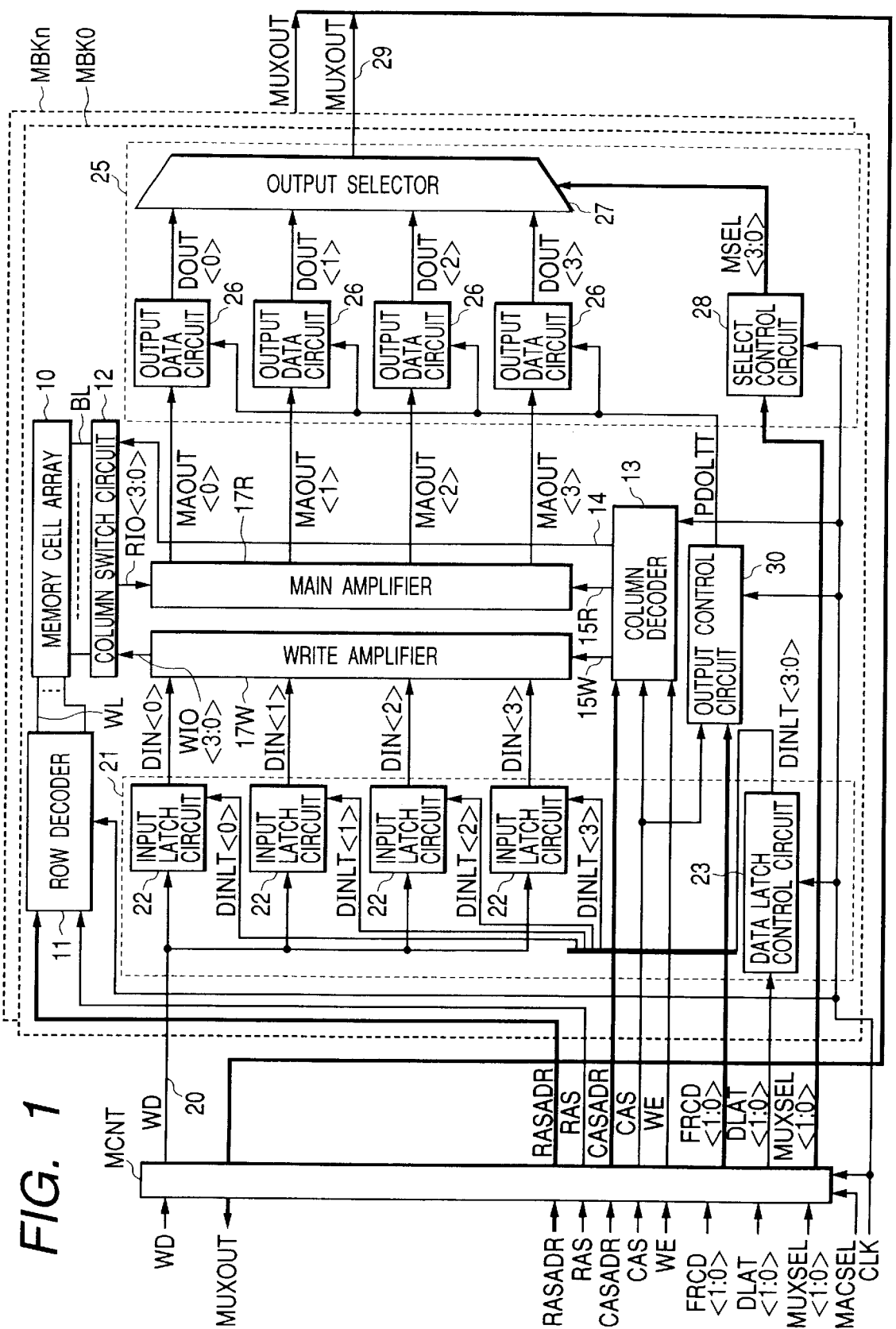
FIG. 1 is a block diagram showing one example of a memory portion of a semiconductor integrated circuit according to the present invention.

FIG. 1 shows one example of the memory portion 4 in more detail. The memory block MBK0 has a memory cell array 10 where a dynamic memory cell, not shown, is arranged in a matrix manner. A selecting terminal of the dynamic memory cell is connected to a word line WL and a data input/output terminal is connected to a complementary bit line BL. Though not shown, the complementary bit line has a fold-back bit line structure with a sense amplifier at its center, and a pre-charge circuit, for example, is located between the complementary bit lines.

A row decoder 11 is a row selector circuit for selecting a word line WL specified by a row address signal RASADR in response to a falling edge of a row address strobe signal RAS. The selection of the complementary bit line BL is performed by a column decoder 13 and a column switch circuit 12. The column decoder 13 generates a column select signal 14 for selecting a plurality of complementary bit lines in parallel, specified through a column address signal CASADR in response to a falling edge of a column address strobe signal CAS. Further, the column decoder 13 activates a write signal 15W in response to an instruction for a write operation by a low level of a write enable signal WE and activates a read signal 15R in response to an instruction for a readout operation by a high level of a write enable signal WE. The column switch circuit 12 switches through a column select signal 14 and passes four pairs of complementary bit lines instructed through the column select signal 14 through four pairs of complementary write data lines WIO<3:0> and four pairs of complementary readout data lines RIO<3:0>.

Supplied to the complementary write data lines WIO<3:0> in parallel is four bits write data output from a write amplifier 17W. Supplied to the complementary readout data line RIO<3:0> is four bit readout data in parallel to a main amplifier 17R. The write amplifier 17W has four write amplifier circuits and is enabled to output in parallel amplification signals in four bits for four bit write data DIN<0> to DIN<3> input in parallel to the complementary write data line WIO<3:0>, in response to the activation of the write signal 15W. The main amplifier 17R has four readout amplifier circuits and is enabled to output in amplification signals for an input from the complementary-readout data line RIO<3:0> as four bit readout data MAOUT<0> to MAOUT<3> data in response to the activation of the readout signal.

A series/parallel converter circuit 21 is located between the write data WD input path 20 and the write amplifier 17W. The write data WD is, but the invention is not limited to, supplied as bit serial data. The series/parallel converter circuit 21 has four input latch circuits 22 and a data latch control circuit 23. Input terminals of the input latch circuit 22 are commonly connected to the input path 20. Their output terminals are coupled with input terminals of the write amplification circuit of the write amplifier 17W separately. The data latch control circuit 23 decodes two bit latch control data DLAT<1:0> in synchronism with the clock signal CLK in order to generate four bit latch control signals DINL<3:0>. Thus, latch control is performed on the corresponding input latch circuit 22. The latch control data LATD<1:0> is incrementally and sequentially changed so that write data WD input as bit serial data is latched in four data latch circuits 22 sequentially in synchronism with clock signals CLK. As a result, the four data latch circuits 22 output four bit parallel write data DIN<0> to DIN<3>.

A parallel/serial converter circuit 25 is located between an output path 29 of readout data MUXOUT and the main amplifier 17R. The parallel/serial converter circuit 25 has four output latch circuits 26, an output selector 27 and a select control circuit 28. Input to input terminals of the output latch circuits 26 are readout data MAOUT<0> to MAOUT<3> from main amplifier 17R, respectively. Latch timing of the output latch circuits 26 is controlled by latch control signals PDOLTT. The latch timing by the latch control signals PDOLTT is controlled by a later-described output control circuit 30 such that they can be latched after readout data MAOUT<0> to MAOUT<3> are determined by data readout from the memory cells.

The selector 27 selects output data DOUT<0> to DOUT<3> from the output latch circuits 26 one bit at a time in response to select control signals MSEL<3:0> for output to the output path 29. The select control circuit 28 decodes two bit select control data MUXSEL<1:0> in synchronism with a clock signal CLK to generate four bit select control signals MSEL<3:0>. When the select control data MUXSEL<1:0> is changed sequentially and incrementally, the output data DOUT<0> to DOUT<3> are output to the output path 29 one bit at a time sequentially in synchronism with clock signals CLK in order to provide readout data MUXOUT.

An output control circuit 30 generates the latch control signals PDOLTT in accordance with CAS latency. CAS latency represents a delay time from a subsequent clock cycle to determination of data input of the parallel/serial converter circuit 25 with respect to a number of cycles of the clock signal CLK when a falling edge of the column address strobe signal CAS is responded to in clock-synchronization during a data readout operation. In more detail, when the falling edge of the column address strobe signal CAS is detected by a falling edge of a clock signal CLK, a number of cycles of clock signals CLK from a falling edge of a clock signal CLK following the falling edge from which the falling edge of the column address strobe signal CAS is detected to a first falling edge of the clock signal CLK under the state where the readout data DOUT<0> to DOUT<3> are determined represents CAS latency when the falling edge of the column address strobe signal CAS is detected through the falling edge of the clock signals CLK. A data readout operation from the memory cell array 10 and an amplification operation of readout data performed by the main amplifier 17R are determined uniquely depending on their circuit configuration and the characteristics of the circuit elements. Thus, in order to output data to the outside rapidly, CAS latency with a delay time not less than their operation delay times and closest thereto must be set. As described above, the CAS latency corresponds to a number of cycles of the clock signal CLK. Thus, the real delay time due to the CAS latency depends on the frequency of the clock signal CLK. Therefore, even when the same delay times are specified, the CAS latency is relatively large when the frequency of the clock signal CLK is high, while the CAS latency is relatively small when the frequency of the clock signal CLK is low. The output control circuit 30 in the example of FIG. 1 inputs latency set data FRCD<1:0> in order to obtain a CAS latency control circuit, which can control the CAS latency in a variable manner. The CAS latency is reflected on the latch timing by the latch control signal PDOLTT.

Figure 2:
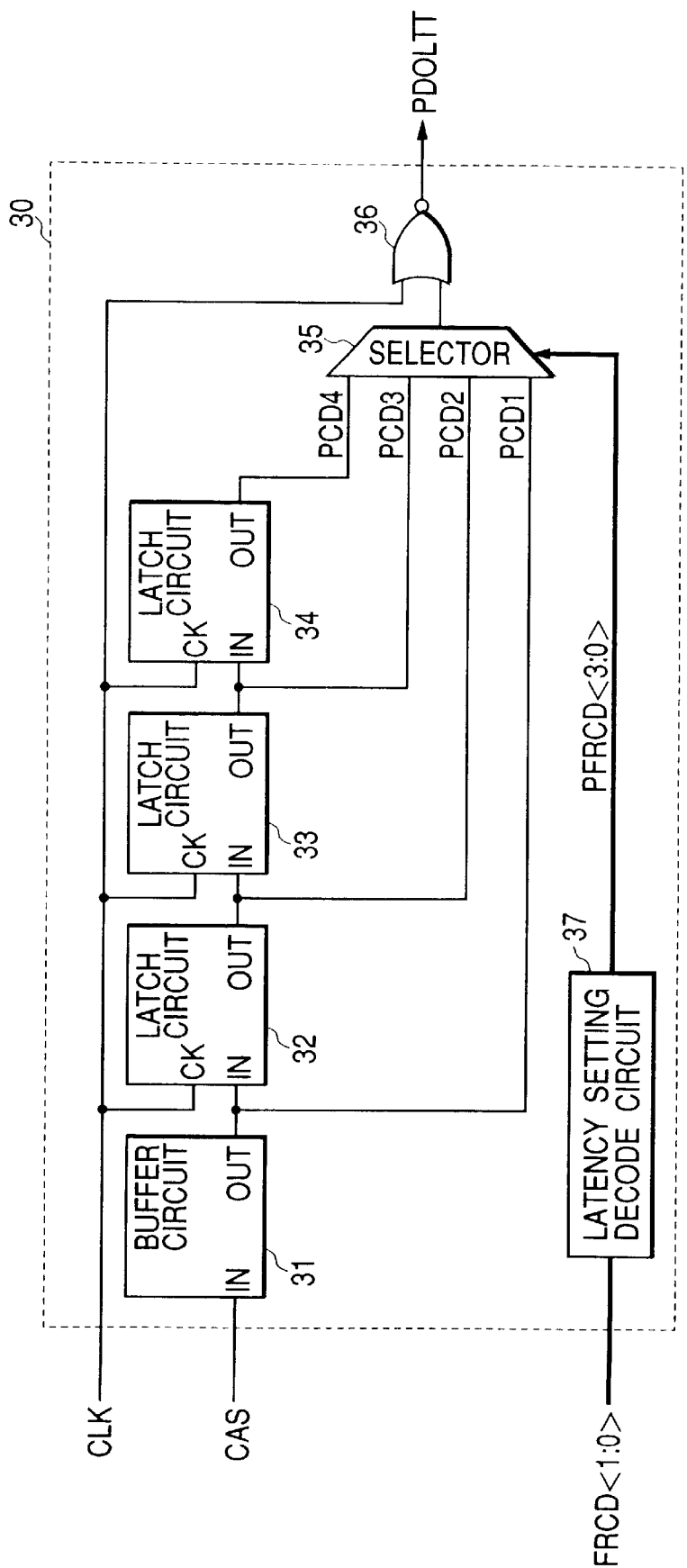
FIG. 2 is a block diagram showing one example of an output control circuit.

FIG. 2 shows one example of the output control circuit 30. The output control circuit 30 has, for performing CAS latency variable control, a serial circuit, formed of a buffer circuit 31 and three latch circuits 32 to 34, a selector 35, a NOR gate 36 and a latency setting decode circuit 37. The latch circuits 32 to 34 include D latches, for example, which latch inputs in synchronism with failing edges of clock signal CLK. Low level changes of the column address strobe signals CAS are sequentially transmitted to the serial circuit formed of the buffer circuit 31 and the latch circuits 32 to 34. The selector 35 inputs an output PCD1 of the buffer circuit 31 and outputs PCD2 to PCD4 of the latch circuits 32 to 34 and selects one of them using a four bit latency setting decode signal PFRCD<3:0>. The selected signal is output as a latch control signal PDOLTT during a low level period of the clock signal CLK through the NOR gate 36. When the latency setting decode signal 37 decodes a two bit latency set signal FRCD<1:0>, a latency setting decode signal PFRCD<3:0> is generated thereby.

Figure 3:
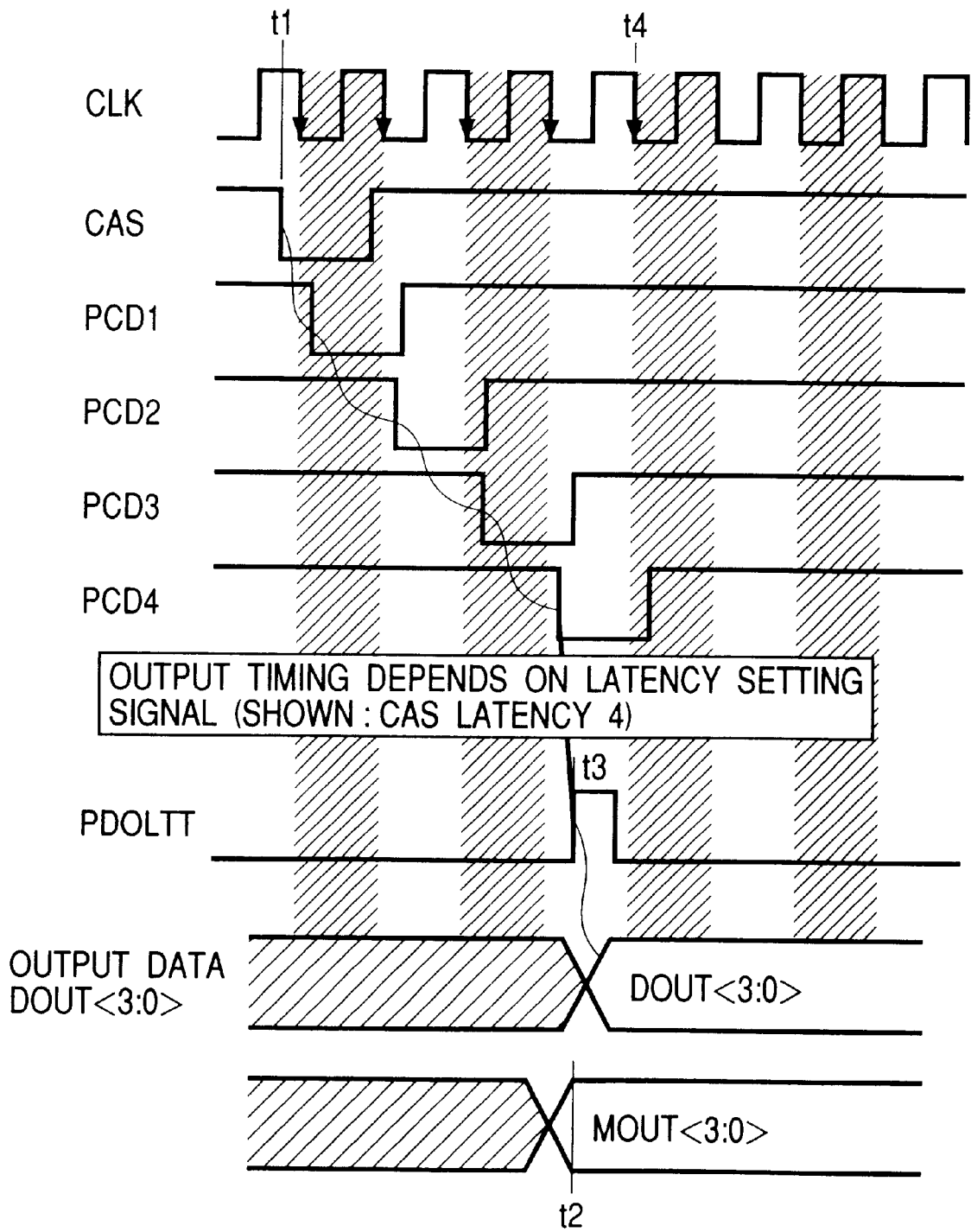
FIG. 3 is a timing chart illustrating the operation timing of data latch control by the output control circuit.

FIG. 3 shows a timing chart of data latch control performed by the output control circuit 30. FIG. 3 shows an example of a case where the CAS latency is set at 4 by the latency set signal FRCD<1:0>. When a column address strobe signal CAS is changed to the low level, the change of the column address strobe signal CAS is input to the selector 35 sequentially as signals PCD1 to PCD4 in synchronism with the falling edge of an immediately following clock signal CLK fall edge. Since the CAS latency is set at 4 in the example shown in FIG. 3, the selector 35 selects the signal PCD4. Thus, when the signal PCD 4 is changed to the low level, the latch control signal PDOLTT is asserted to the high level in synchronism with the low level period of the clock signal CLK from the NOR gate 36. In the example in FIG. 3, an output MOUT<3:0> from the sense amplifier 17R is determined (time t2) during a time period from the falling edge of the column address signal CAS (time t1) to the time when the latch control signal PDOLTT is high-level changed (time t3). The output latch circuit 26 completes a latch operation during the time period from the falling edge of the column address signal CAS (time t1) to the fourth cycle of the clock signal CLK (time t4). Then, the latch output data DOUT<3:0> is determined.

Figure 4:
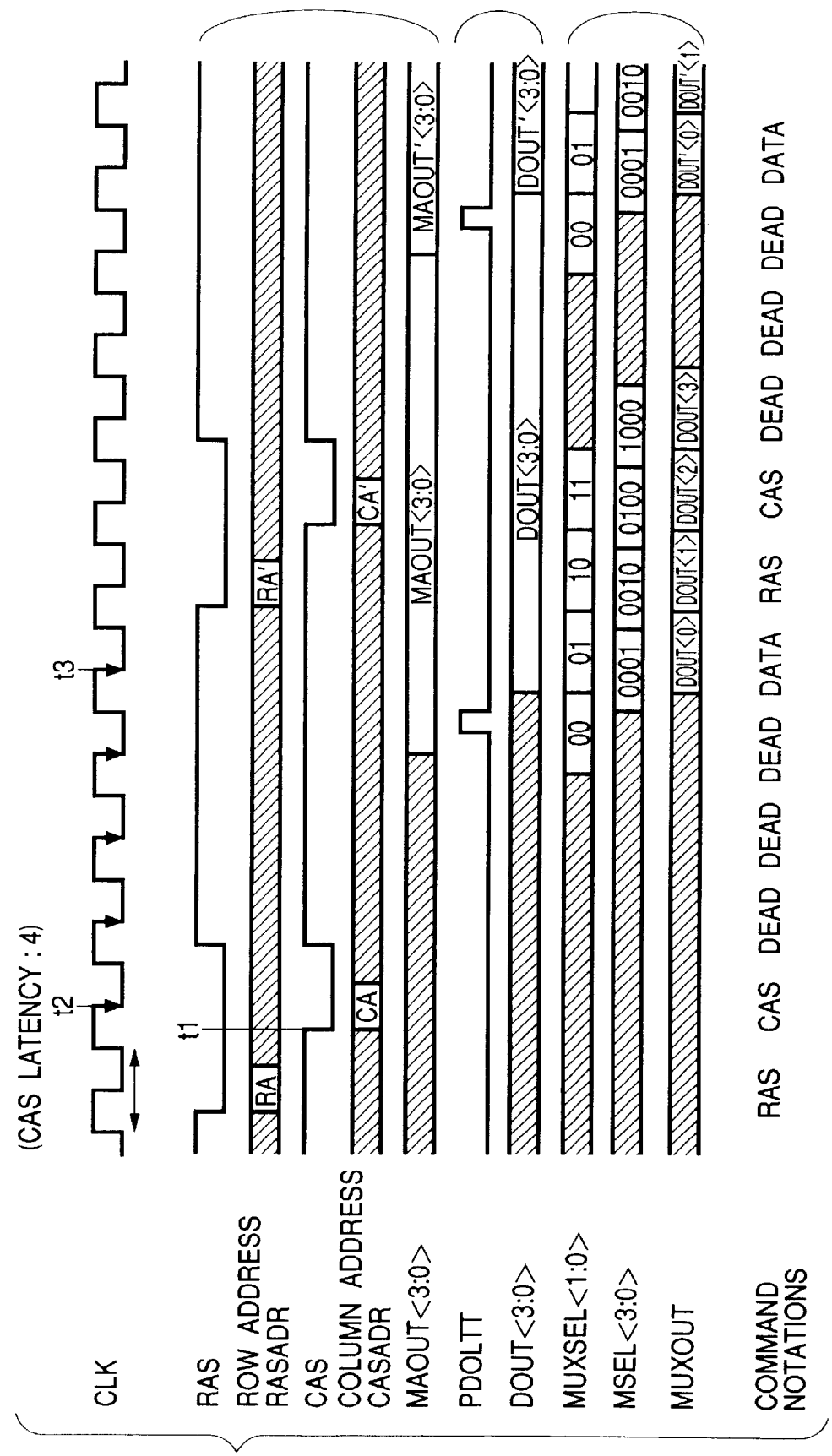
FIG. 4 is a timing chart illustrating the read operation timing when CAS latency is set to 4.

FIG. 4 shows read operation timing in the case where the CAS latency is set at 4. The falling edge of the column address strobe signal CAS (time t1) is detected at the time t2 falling edge (time t2). The data MOUT<3:0> is determined until the time t3 in the fourth cycle from the next falling edge of the clock signal CLK. Then, the latch control signal PDOLTT is asserted and readout data DOUT<3:0> is determined. After that, data MOUT<3:0> is selected by the selector 35 to be output as serial data MXOUT. Here, the (A) part in FIG. 4 represents an operation for outputting, from main amplifier 17R, data of a memory cell specified by a row address and a column address. The (B) part in FIG. 4 shows an operation for latching and outputting the output from the main amplifier 17R through the data latch signal PDOLTT. The (C) part shown in FIG. 4 shows an operation for outputting to the outside of the memory block data specified among those from latch output data DOUT<3:0> to MUXSEL<1:0> sequentially in series for four cycles.

Figure 5:
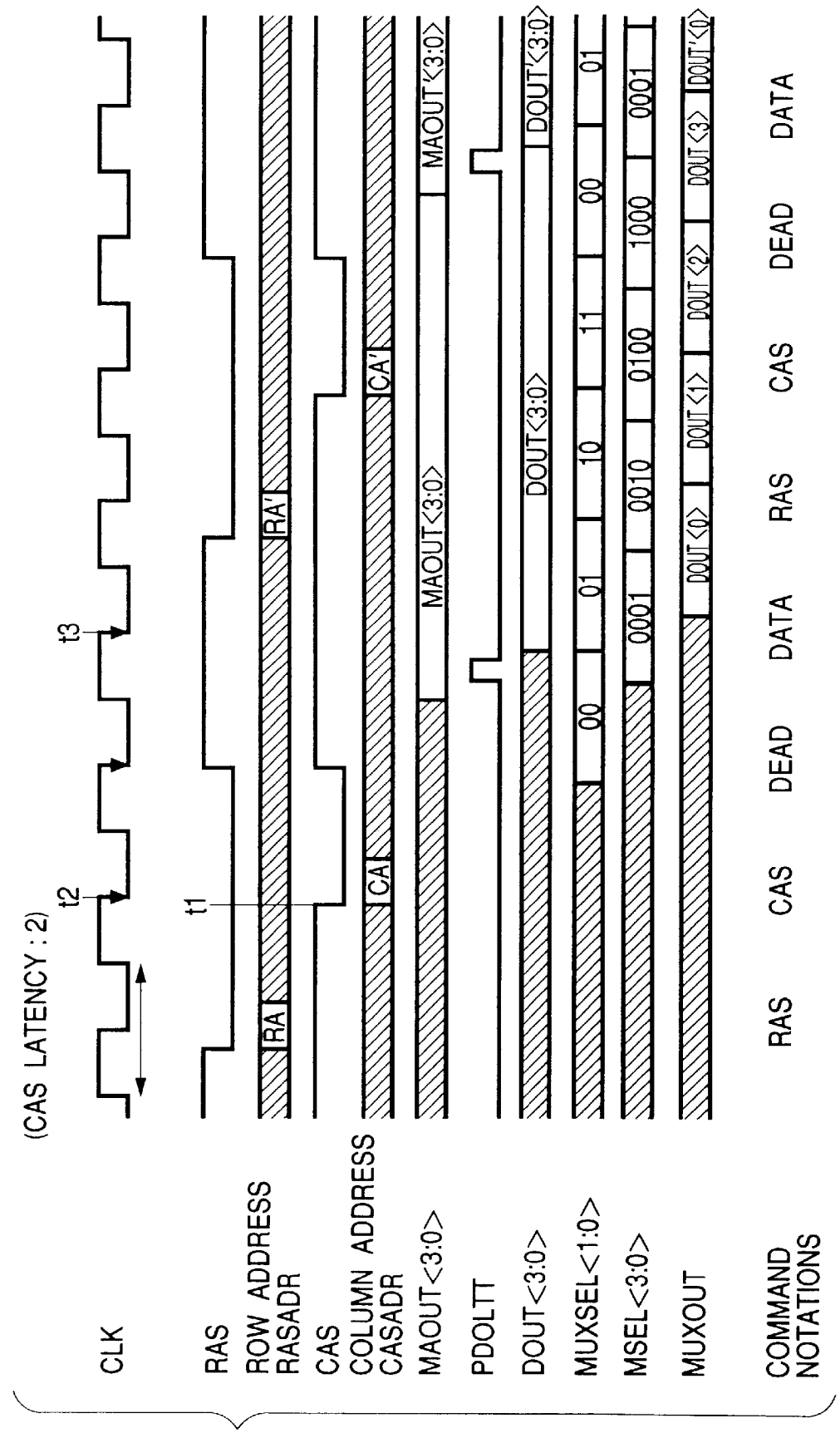
FIG. 5 is a timing chart illustrating the read operation timing when CAS latency is set in 2.

FIG. 5 shows read operation timing in the case where the CAS latency is set at 2. A relatively low clock frequency is adopted for a clock signal CLK in comparison with the case in FIG. 4. The falling edge of the column address strobe signal CAS (time t1) is detected at the time t2 falling edge (time t2). The data MOUT<3:0> is determined until the time t3 in the second cycle from the next falling edge of the clock signal PLK. Then, the latch control signal PDOLLT is asserted and readout data DOUT<3:0> is determined. After that, data MOUT<3:0> is selected by the selector 35 to be output as serial data MXOUT.

Figure 6:
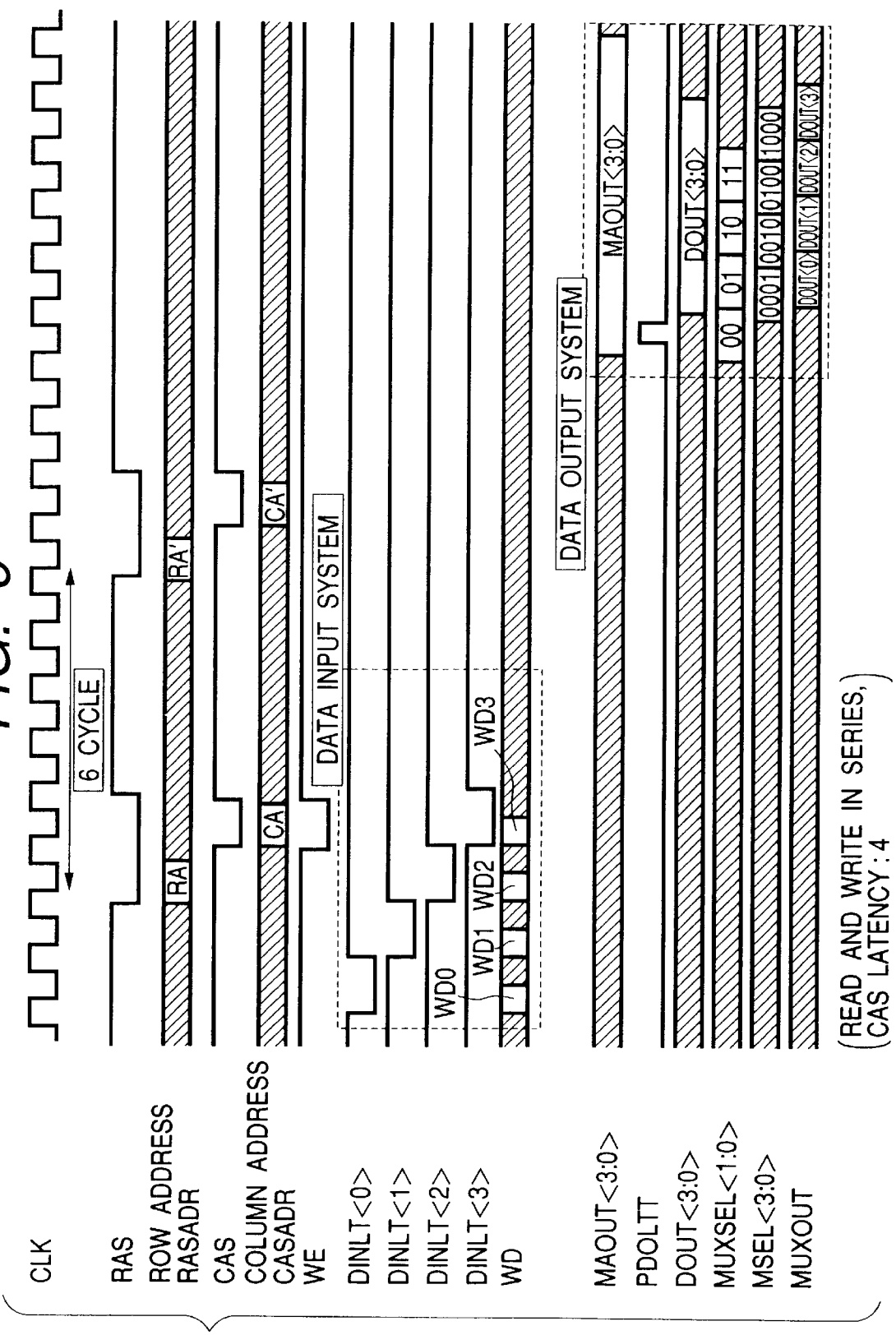
FIG. 6 is a timing chart illustrating the operation in a case where a read operation is performed on a memory block subsequently to a write operation when the CAS latency of 4 is specified.
Figure 7:
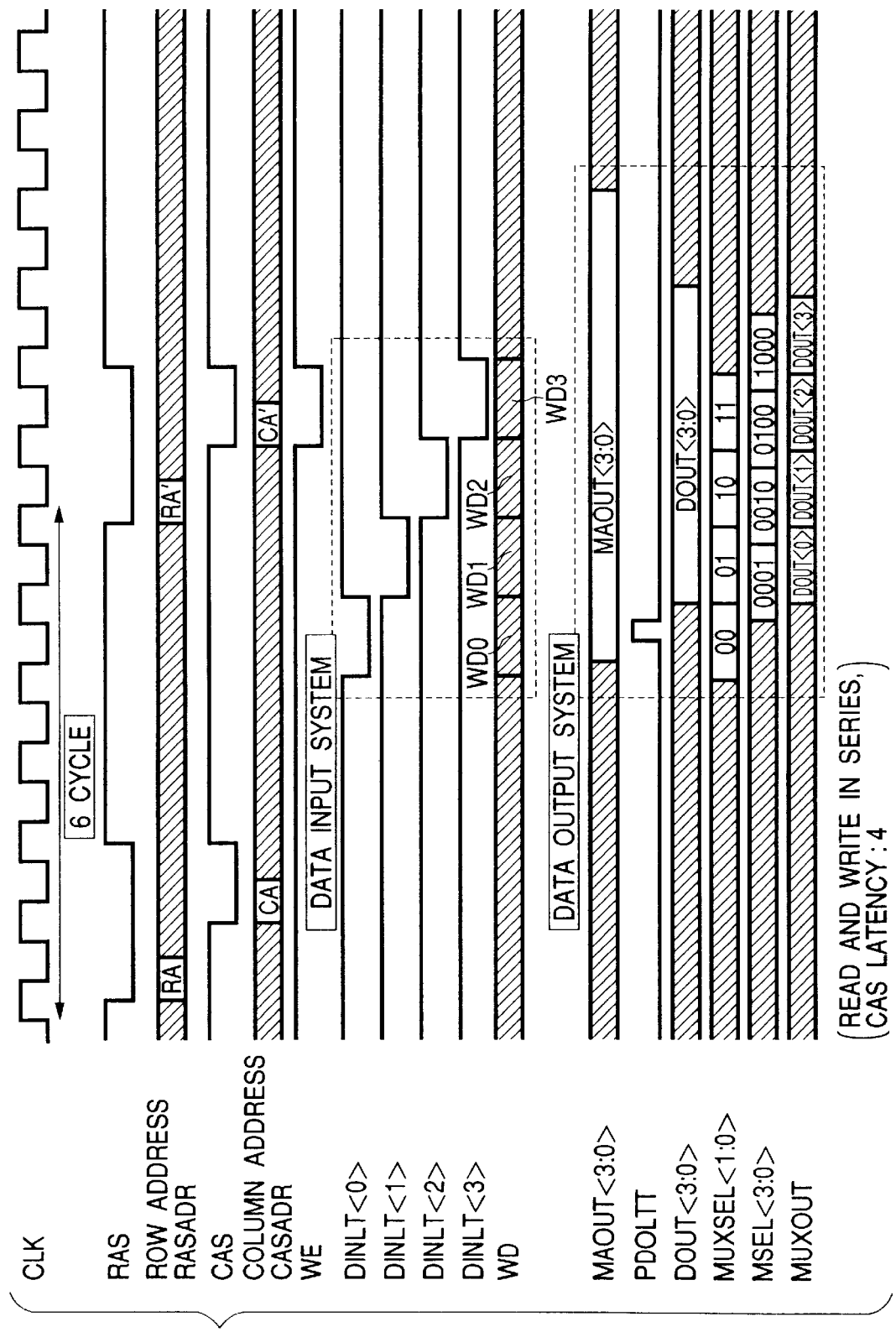
FIG. 7 is a timing chart illustrating the operation in a case where a write operation is performed on a memory block subsequently to a read operation when the CAS latency if 4 is specified.

FIG. 6 shows operation timing in a case where a read operation is performed subsequently to a write operation when the CAS latency 4 is specified in the memory block. FIG. 7 shows operation timing in a case where a write operation is performed subsequently to a read operation when the CAS latency 4 is specified in the memory block.

In the write operation, before parallel data is written into the memory cell array 10 in response to the change in the column address strobe signal CAS, serial data WDCF to WD3 having been input to the memory block in advance must be converted to parallel data completely in synchronism with input latch control signals DINLT<0> to DINLT<3>. In the read operation, the parallel data MOUT<3:0> is read out from the memory cell array in response to the change in the column address strobe signal CAS, and then serial data DOUT<0> to DOUT<3> is output from the memory block where a time for parallel/serial conversion is necessary between the readout and the output.

In this case, as shown in FIG. 6, when the read operation is instructed subsequently to the write operation, an operation for inputting serial data for the write operation to the memory block sequentially in series and an operation for outputting the serial data produced by the read operation from the memory block do not overlap. On the other hand, as shown in FIG. 7, when the write operation is instructed subsequently to the read operation, the operation for inputting the serial data by the read operation to the memory block in advance sequentially in series must be performed in parallel with the operation for outputting the serial data produced by the read operation from the memory block. That is, the timing for outputting serial data from the memory block and the timing for inputting serial data to the memory block overlap. Even in this situation, the serial data input path 20 and the serial data output path 29 of the memory block are provided independently. Therefore, no data collision occurs in spite of the overlap, which allows efficient accesses.

The configuration of the memory block described above is common in the memory blocks MBK0 to MBKn. The memory controller MCONT in FIG. 1 inputs a select signal MACSEL for the memory blocks and connects the serial input data WD, serial output data MUXOUT, row address signal RASADR, row address strobe signal PAS, column address signal CASADR, column address strobe signal CAS, write enable signal WE, FRCD<1:0>, DLAT<1:0> and MUSSEL<1:0> to one or a plurality of memory blocks selected by the select signal MACSEL. For data and signals WD, MUXOUT, PASADR, RAS, CASADR, CAS, WE, FRCD<1:0>, DLAT<1:0>, MUXSEL<1:0> the memory interface portion 3 side of the memory controller MCNT, data and signals WD, MUXOUT, RASADR, RAS, CASADR, CAS, WE, FRCD<1:0>, DLAT<1:0>, MUSSEL<1:0> the memory block side of the memory controller MCNT are synchronized with clock signals CLK.

As understood from the description above, when the CAS latency is 4, a row address strobe signal RAS and column address strobe signal CAS are asserted to the low level for every 6 cycles of the clock signal. When the CAS latency is 2, the row address strobe signal RAS and the column address strobe signal CAS are asserted to the low level for every four cycles of the clock signal CLK. Input to the memory blocks MBK0 to MBKn is the column address strobe signal CAS, which is varied a plurality of times of the cycle of the clock signal CLK. Then, a plurality of serial data read out from the memory cell array 10 and parallel/serial converted in synchronism with the cycles of the clock signal CLK are output from the memory block. Further, parallel data, input to the memory block in synchronism with the cycles of the clock signal CLK and serial/parallel converted, is written in the memory cell array 10. In this way, the access specification that the column address strobe signal CAS is varied once per a plurality of cycles of the clock signal CLK allows more rapid memory operation.

Figure 8:
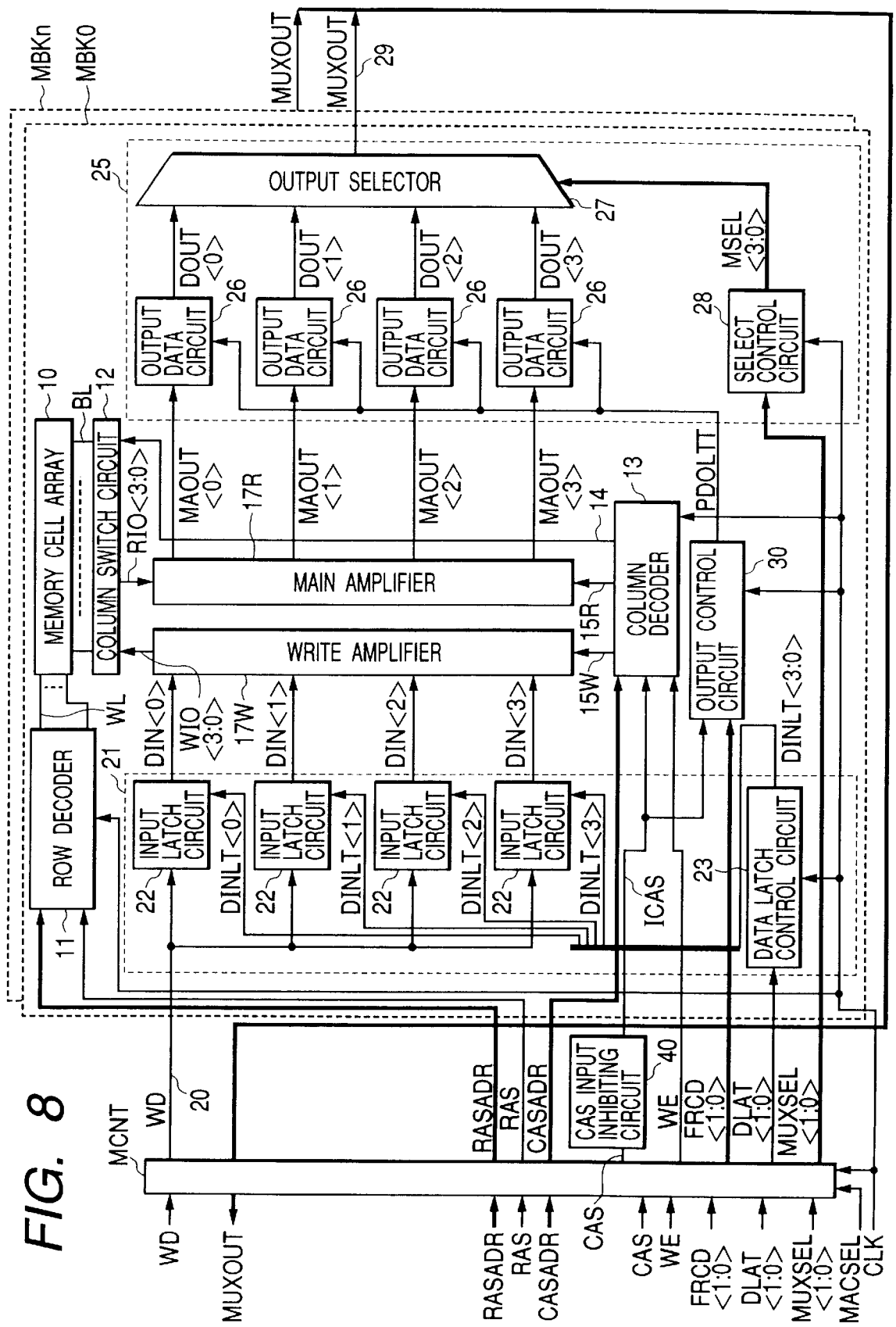
FIG. 8 is a block diagram showing another example of a memory portion of the semiconductor integrated circuit according to the present invention.

For the access specification that the column address strobe signal CAS is varied once per a plurality of cycles of the clock signal CLK, the column address strobe signal CAS must be generated in order to satisfy the specification. In the system shown in FIG. 12, a column address strobe signal CAS is generated such that the memory interface portion 3 can satisfy the specification. In this case, when a clock signal CLK with a higher frequency is used, the cycle of the column address strobe signal CAS gets shorter. As a result, the timing margin for generating the signal CAS gets stricter. Thus, when the waveform of the clock signal CLK or the column address strobe signal CAS are disordered due to influences of noises, for example, the specification of the column address strobe signal CAS for the clock signal CLK may not be satisfied. In order to prevent this, a CAS input inhibiting circuit 40 for inhibiting an input of a new change of the column address strobe signal CAS can be adopted, which follows the CAS latency from a falling edge of the column address strobe signal CAS to latch of readout data to the parallel/serial converter circuit 25. The CAS input inhibiting circuit 40 itself will be described in detail later. The CAS input inhibiting circuit 40 may be provided in the memory controller MCNT, as illustrated in FIG. 1, or it may be located in each of the memory blocks MBK0 to MBKn, as illustrated in FIG. 8. In the latter case, the required number of CAS input inhibiting circuits 40 is increased. However, they can be located in the vicinity of the column decoder 13. Thus, the reliability for obtaining the effect of the CAS input inhibiting circuit 40 gets higher than that in the former case.

The CAS input inhibiting circuit 40 will be described in detail with reference to the example shown in FIG. 8. FIG. 8 is identical to FIG. 1 in configuration, except for the provision of the CAS input inhibiting circuit 40. In FIG. 8, a notation ICAS is conveniently used for a column address strobe signal output from the CAS input inhibiting circuit 40 so that it can be distinguished from its input. The column address strobe signal ICAS is supplied to the column decoder 13 and the output control circuit 30.

Figure 9:
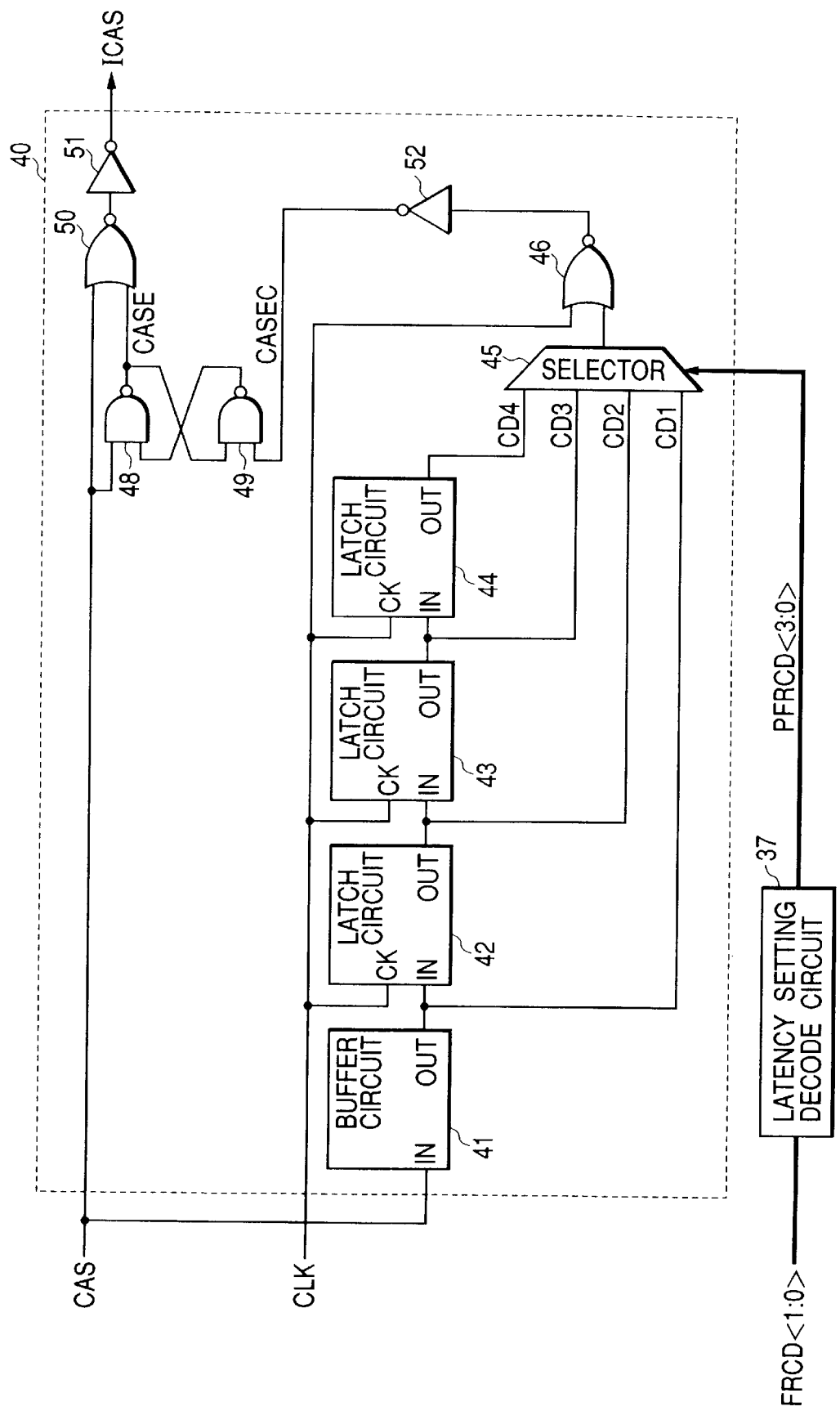
FIG. 9 is a block diagram showing one example of a CAS input inhibiting circuit.

FIG. 9 shows one example of the CAS input inhibiting circuit 40. The CAS input inhibiting circuit 40 has a serial circuit including a buffer circuit 41 and three latch circuits 42 to 44, a selector 45, a NOR gate 46, NAND gates 48 and 49, a NOR gate 50, and inverters SI and 52. The latch circuits 42 to 44 include D latches, for example, which latch inputs in synchronism with falling edges of the clock signal CLK. Low level changes of the column address strobe signals CAS are sequentially transmitted to the serial circuit of the buffer circuit 41 and the latch circuits 42 to 44. The selector 45 inputs an output CD1 of the buffer circuit 41 and outputs CD2 to CD4 of the latch circuits 42 to 44 and selects one of them using the four bit latency setting decode signal PFRCD<3:0>. The selected signal is output during a low level period of the clock signal CLK through the NOR gate 46. The output signal is inverted by the inverter 52 to become a signal CASEC.

The NAN D gates 48 and 49 form a set/reset type flip-flop such that an output from one is fed back to an input of the other. When a column address strobe signal, CAS is changed to the low level, the signal CASE is inverted and kept to the high level after a lapse of the operation delay time of the NAND gate 48. During that period of time, a column address strobe signal ICAS generates a pulse change once in response to a period when both signals CAS and CASE are changed to the low level. After that, unless the signal CASE is inverted to the low level, the change in ICAS is suppressed regardless of the change in CAS. The suppressed state is released by resetting the flip-flop 48, 49 by the low level of the signal CASEC and changing the signal CASE to the low level. When the signal CAS is fall-edge changed during the release period, the change is reflected on the signal ICAS.

Figure 10:
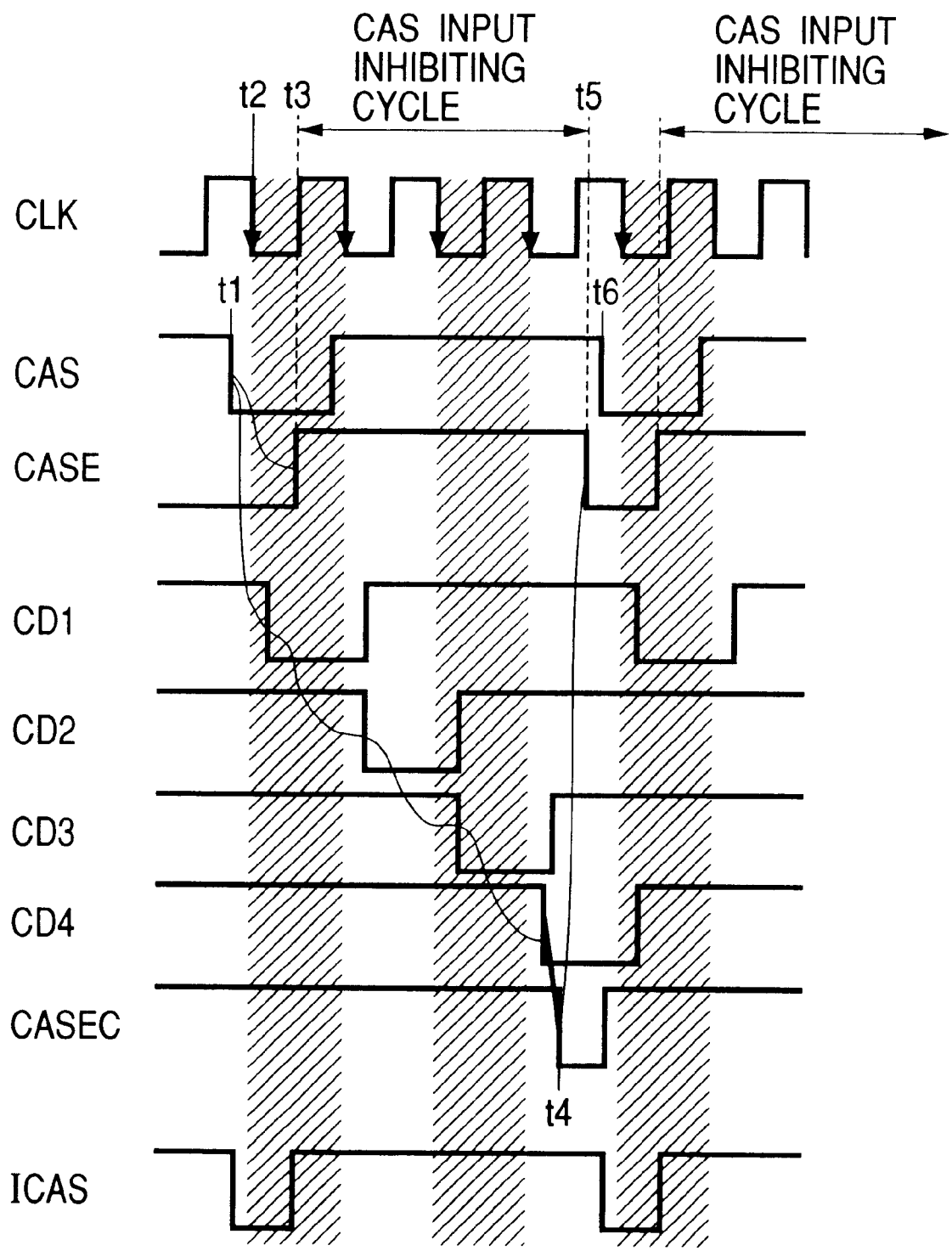
FIG. 10 is a timing chart illustrating the operation timing by the CAS input inhibiting circuit.

FIG. 10 shows the operation timing by the CAS input inhibiting circuit 40. FIG. 10 shows an example of a case where the CAS latency is set to 4 by a latency set signal FRCD<1:0>. When the column address strobe signal CAS is changed to the low level (time t1), the change in the column address strobe signal CAS is input to the selector 45 sequentially as signals CD1 to CD4 in synchronism with the falling edge (time t2) of the clock signal CLK immediately thereafter. The low level change of the column address strobe signal CAS inverts the signal CASE to the high level (time t3) after 4 lapse of the operation delay time of the NAND gate 48. The state is maintained by a collaboration effect with the NAND gate 49 forming a flip-flop together. During that time, the column address strobe signal ICAS generates a pulse change once in response to a period when both signals CAS and CASE are changed to the low level. After that, unless the signal CASE is inverted to the low level, the change in the column address strobe signal ICAS is suppressed regardless of the change in the column address strobe signal CAS. In the example shown in FIG. 10, since the CAS latency is set to 4, the selector 45 selects the signal CD4. Thus, when the signal CD4 is changed to the low level, the signal CASEC passes through NOR gate 46 and the inverter 52 and is asserted to the low level (time t4) in synchronism with the low level period of the clock signal CLK. As a result, the flip-flop formed by the NAND gates 48 and 49 are reset, and the signal CASE is changed to the low level (time t5). When the signal CAS is fall-edge changed during the release period (time t6), the change is reflected on the signal ICAS. In the example of a CAS latency of 4 in FIG. 10, the CAS input inhibiting cycle covers the period from the time t3 to the time t5.

Figure 11:
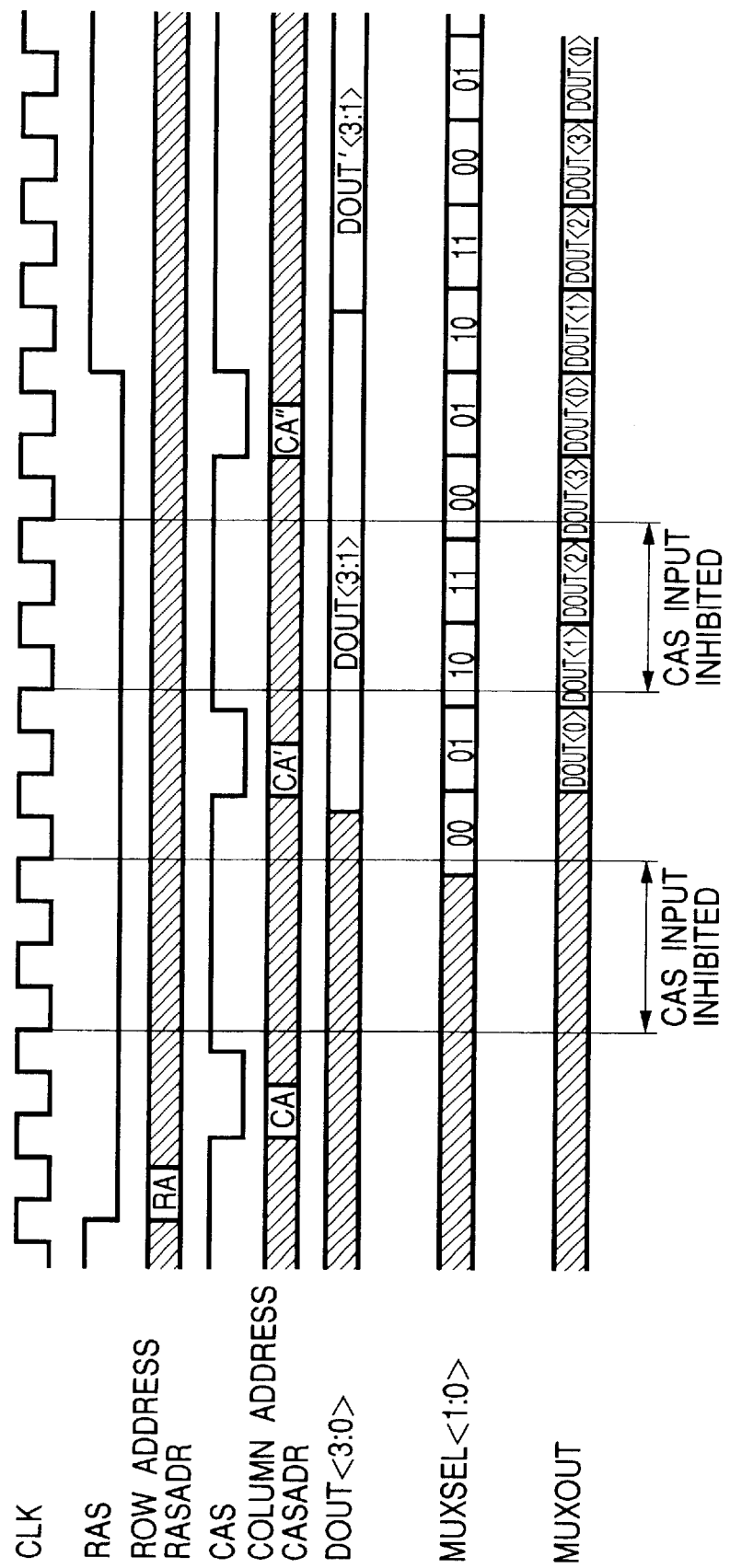
FIG. 11 is a timing chart illustrating continuous data readout operations through column address strobe signals.

FIG. 11 illustrates an example of the operation timing pf burst readout or continuous data readout by a column address strobe signal CAS as in a nibble mode. Here again, this is a case where the CAS latency is set to 4. One falling edge of the row address strobe signal RAS is arranged to change the column address strobe signal CAS three times so as to read out data three times in series. In this case, the effect produced by the CAS input inhibiting circuit 40 provides a CAS input inhibiting period. Therefore, even when the column address strobe signal CAS is changed undesirably due to noises, for example, during that period, it is not reflected on the column address strobe signal ICAS so that continuous readout operations can be performed normally.

Thus, when a column address strobe signal CAS from the outside does not satisfy the access specification that a column address strobe signal is changed once per n cycles of the clock signal, an error operation can be prevented.

While the present invention has been described specifically based on various embodiments, the present invention is not intended to be limited thereto and can be changed in various ways without departing from its principle.

For example, the serial/parallel converting or parallel/serial converting bit number is not limited to 4 bits and can be changed properly. Further, the logic portion consolidated with the memory block is not limited to the configuration shown in FIG. 12. The present invention is not limited to the logic consolidated DRAM and can be applied to a semiconductor integrated with a DRAM alone.

Effects, which can be obtained by the present invention disclosed herein can be described as follows:

The access specification that the column address strobe signal CAS is varied once per a plurality of cycles of the clock signal allows for a more rapid memory operation.

Further, when a column address strobe signal CAS from the outside does not satisfy the access specification that a column address strobe signal is changed once per a plurality of cycles of the clock signal, an error operation can be prevented.

What is claimed is:

1. A semiconductor device comprising a memory block, said memory block including:
   a memory cell array having a plurality of memory cells whose selector terminal is connected to a word line and whose data input/output terminal is connected to a bit line;
   a row select circuit for selecting a word line specified by a row address signal in response to a change in a row address strobe signal in synchronous with a clock signal;
   a column select circuit for selecting a plurality of bit lines in parallel specified by a column address signal in response to a change in a column address strobe signal in synchronous with a clock signal;
   a serial/parallel converter circuit for converting serial data from the outside to parallel data in synchronous with a clock signal;
   a write amplifier for outputting in parallel an output from said serial/parallel converter circuit to said plurality of bit lines selected by said column select circuit;
   a main amplifier for amplifying said parallel data output in parallel from said plurality of bit lines selected by said column select circuit; and
   a parallel/serial converter circuit for converting parallel data supplied from said main amplifier to serial data in synchronous with a clock signal,
   wherein said column address strobe signal which is changed in cycles as many as a plurality of times of a clock signal cycle is input to said memory block.

2. A semiconductor device according to claim 1, said memory block further including independently a serial data input path of said serial/parallel converter circuit and a serial data output path of said parallel/serial converter circuit.

3. A semiconductor device according to claim 1, further comprising a CAS input inhibiting circuit for inhibiting an input of a new change in said column address strobe signal in accordance with a CAS latency corresponding to the number of said clock signal cycle during a period from one next to clock synchronous timing for said change in column address strobe signal to determination of an data input of said parallel/serial converter circuit.

4. A semiconductor device according to claim 3, further comprising a CAS latency control circuit, which can input a latency set signal so as to control said CAS latency in variable manner, wherein said CAS latency control circuit controls timing for latching parallel outputs from said main amplifier in said parallel/serial converter circuit.

5. A semiconductor device according to claim 4, wherein said CAS input inhibiting circuit suppresses an input of a new change in said column address strobe signal until immediately before a lapse of a period corresponding to a CAS latency specified by said latency set signal.

6. A semiconductor device comprising:

a plurality of word lines;

a plurality of data lines;

a plurality of memory cells located at intersections of said plurality of word lines and said plurality of data lines;

a first terminal for receiving a first synchronous signal;

a second terminal for receiving a second synchronous signal;

a plurality of data transmission switch circuits connected to said plurality of data lines;

a first select circuit for selecting one of said plurality of word lines corresponding to a first address signal input in synchronous with said first synchronous signal;

a second select circuit for selecting at least two of said plurality of data transmission switch circuits corresponding to a second address signal inputted in synchronous with said second signal;

a data converter circuit including an input terminal and a plurality of output terminals for outputting in parallel a plurality of first data inputted in series to said input terminal to said plurality of output terminals;

a transmission path for transmitting said data from said plurality of output terminals of said data converter circuit to said plurality of data transmission switches; and a circuit for ignoring a signal input to said second terminal for a predetermined period from a time when said second synchronous signal is inputted to said second terminal.

7. A semiconductor device comprising:

a plurality of word lines;

a plurality of data lines;

a plurality of memory cells located at intersections of said plurality of word lines and said plurality of data lines;

a first terminal for receiving a first synchronous signal;

a second terminal for receiving a second synchronous signal;

a third terminal for receiving clock signals a plurality of data transmission switch circuits connected to said plurality of data lines;

a first select circuit for selecting one of said plurality of word lines corresponding to a first address signal input in synchronous with said first synchronous signal;

a second select circuit for selecting at least two of said plurality of data transmission switch circuits corresponding to a second address signal input in synchronous with said second signal;

a data converter circuit including an input terminal and a plurality of output terminals for outputting in parallel a plurality of first data inputted in series to said input terminal to said plurality of output terminals;

a transmission path for transmitting said data from said plurality of output terminals of said data converter circuit to said plurality of data transmission switches; and a circuit for ignoring a signal input to said second terminal for a predetermined period from a time when said second synchronous signal is inputted to said second terminal, wherein said predetermined period is as long as predetermined times of said cycles of said clock signal.

8. A semiconductor device comprising a memory block, said memory block including:

a memory cell array having a plurality of memory cells whose selector terminal is connected to a word line and whose data input/output terminal is connected to a bit line;

a row select circuit to select a word line specified by a row address signal in response to a change in a row address strobe signal in synchronism with a clock signal;

a column select circuit to select a plurality of bit lines in parallel specified by a column address signal in response to a change in a column address strobe signal in synchronism with a clock signal;

a serial/parallel converter circuit to convert serial data from the outside to parallel data in synchronism with a clock signal;

a write amplifier to output in parallel an output from said serial/parallel converter circuit to said plurality of bit lines selected by said column select circuit;

a main amplifier to amplify said parallel data output in parallel from said plurality of bit lines selected by said column select circuit;

a parallel/serial converter circuit to convert parallel data supplied from said main amplifier to serial data in synchronism with a clock signal, and means for changing said column address strobe signal once per n cycles of a clock signal input to said memory block.

9. A semiconductor device according to claim 8, said memory block further including independently a serial data input path of said serial/parallel converter circuit and a serial data output path of said parallel/serial converter circuit.

* * * * *